US009508871B2

(12) United States Patent
Sakurano et al.

(10) Patent No.: US 9,508,871 B2
(45) Date of Patent: Nov. 29, 2016

(54) SOLID-STATE IMAGE SENSING DEVICE WITH ELECTRODE IMPLANTED INTO DEEP TRENCH

(71) Applicants: Katsuyuki Sakurano, Hyogo (JP); Takaaki Negoro, Osaka (JP); Yoshinori Ueda, Hyogo (JP); Kazuhiro Yoneda, Osaka (JP); Katsuhiko Aisu, Hyogo (JP); Yasukazu Nakatani, Hyogo (JP); Hirofumi Watanabe, Hyogo (JP)

(72) Inventors: Katsuyuki Sakurano, Hyogo (JP); Takaaki Negoro, Osaka (JP); Yoshinori Ueda, Hyogo (JP); Kazuhiro Yoneda, Osaka (JP); Katsuhiko Aisu, Hyogo (JP); Yasukazu Nakatani, Hyogo (JP); Hirofumi Watanabe, Hyogo (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/847,567

(22) Filed: Sep. 8, 2015

(65) Prior Publication Data

US 2016/0126271 A1 May 5, 2016

(30) Foreign Application Priority Data

Nov. 4, 2014 (JP) ................................ 2014-224272

(51) Int. Cl.
*H01L 29/86* (2006.01)
*H01L 27/146* (2006.01)
(Continued)

(52) U.S. Cl.
CPC ......... *H01L 29/868* (2013.01); *H01L 27/1461* (2013.01); *H01L 27/1463* (2013.01); *H01L 27/14603* (2013.01); *H01L 27/14612* (2013.01); *H01L 27/14643* (2013.01); *H01L 29/866* (2013.01)

(58) Field of Classification Search
CPC .................... H01L 27/14603; H01L 27/1461; H01L 27/1463; H01L 27/14643; H01L 29/868; H01L 29/866
See application file for complete search history.

(56) References Cited

U.S. PATENT DOCUMENTS 5,031,019 A 7/1991 Kosaka et al.
5,227,793 A 7/1993 Aisu
(Continued)

FOREIGN PATENT DOCUMENTS

JP 2000-299453 10/2000
JP 2013-048132 3/2013
JP 2015-056622 3/2015

OTHER PUBLICATIONS

U.S. Appl. No. 07/289,909, filed Dec. 27, 1988.
(Continued)

*Primary Examiner* — Thanh V Pham
(74) *Attorney, Agent, or Firm* — Cooper & Dunham LLP

(57) ABSTRACT

A solid-state image sensing device is provided including a first semi-conducting layer of first conductivity, a second semi-conducting layer of first conductivity disposed on the first semi-conducting layer, a semiconductor region of second conductivity different from the first conductivity disposed in the second semi-conducting layer, a deep trench configured to isolate a plurality of neighboring pixels from each other, and an electrode implanted into the deep trench, where the semiconductor region of second conductivity, the second semi-conducting layer, and the first semi-conducting layer are disposed in that order from a proximal side to a distal side, the second semi-conducting layer is split by the deep trench into sections that correspond to the pixels, an impurity concentration of first conductivity of the first semi-conducting layer is higher than an impurity concentration of first conductivity of the second semi-conducting layer, and the deep trench contacts the first semi-conducting layer.

9 Claims, 6 Drawing Sheets

(51) Int. Cl.
*H01L 29/868* (2006.01)
*H01L 29/866* (2006.01)

(56) References Cited

U.S. PATENT DOCUMENTS

| | | | |
|---|---|---|---|
| 5,656,841 | A | 8/1997 | Watanabe et al. |
| 5,825,673 | A | 10/1998 | Watanabe |
| 6,075,404 | A | 6/2000 | Shindoh et al. |
| 6,271,730 | B1 | 8/2001 | Abe et al. |
| 6,278,322 | B1 | 8/2001 | Aisu et al. |
| 6,423,993 | B1 | 7/2002 | Suzuki et al. |
| 2001/0020844 | A1 | 9/2001 | Andoh et al. |
| 2002/0036488 | A1 | 3/2002 | Ueda |
| 2002/0195661 | A1 | 12/2002 | Ueda |
| 2003/0001206 | A1 | 1/2003 | Negoro et al. |
| 2003/0197552 | A1 | 10/2003 | Watanabe |
| 2003/0214336 | A1 | 11/2003 | Watanabe |
| 2004/0004992 | A1 | 1/2004 | Aota et al. |
| 2004/0075147 | A1 | 4/2004 | Ueda et al. |
| 2004/0145016 | A1 | 7/2004 | Ueda |
| 2004/0175007 | A1 | 9/2004 | Aisu |
| 2004/0183119 | A1 | 9/2004 | Negoro et al. |
| 2004/0227183 | A1 | 11/2004 | Negoro et al. |
| 2005/0002429 | A1 | 1/2005 | Nakatani |
| 2005/0017297 | A1 | 1/2005 | Shimizu et al. |
| 2005/0040803 | A1 | 2/2005 | Ueda |
| 2005/0141395 | A1 | 6/2005 | Nakatani |
| 2005/0218478 | A1 | 10/2005 | Watanabe |
| 2006/0065949 | A1 | 3/2006 | Kato et al. |
| 2006/0138546 | A1 | 6/2006 | Negoro et al. |
| 2006/0152284 | A1 | 7/2006 | Morino |
| 2006/0197581 | A1 | 9/2006 | Chun et al. |
| 2007/0023517 | A1 | 2/2007 | Tan et al. |
| 2007/0047332 | A1 | 3/2007 | Aota et al. |
| 2007/0102638 | A1 | 5/2007 | Watanabe |
| 2007/0109039 | A1 | 5/2007 | Watanabe |
| 2007/0111557 | A1 | 5/2007 | Higashiguchi et al. |
| 2007/0188216 | A1 | 8/2007 | Negoro |
| 2008/0006875 | A1 | 1/2008 | Ohtsuka et al. |
| 2008/0012543 | A1 | 1/2008 | Negoro |
| 2008/0100276 | A1 | 5/2008 | Negoro |
| 2009/0033420 | A1 | 2/2009 | Negoro |
| 2009/0064791 | A1 | 3/2009 | Ueda et al. |
| 2011/0012582 | A1 | 1/2011 | Aisu |
| 2011/0042745 | A1 | 2/2011 | Negoro |
| 2011/0155913 | A1 | 6/2011 | Noguchi et al. |
| 2011/0169570 | A1 | 7/2011 | Aota et al. |
| 2011/0181358 | A1 | 7/2011 | Aisu |
| 2011/0185326 | A1 | 7/2011 | Ueda et al. |
| 2012/0013383 | A1 | 1/2012 | Negoro et al. |
| 2012/0032733 | A1 | 2/2012 | Negoro |
| 2012/0181430 | A1 | 7/2012 | Noguchi et al. |
| 2013/0049156 | A1 | 2/2013 | Furukawa et al. |
| 2013/0127504 | A1 | 5/2013 | Hayashi et al. |
| 2013/0187030 | A1 | 7/2013 | Hayashi et al. |
| 2013/0234277 | A1 | 9/2013 | Negoro et al. |
| 2013/0240716 | A1 | 9/2013 | Hayashi et al. |
| 2013/0284931 | A1 | 10/2013 | Nagahisa et al. |
| 2014/0239158 | A1 | 8/2014 | Hayashi et al. |
| 2014/0367550 | A1 | 12/2014 | Aisu et al. |
| 2015/0070546 | A1 | 3/2015 | Negoro et al. |
| 2015/0076572 | A1 | 3/2015 | Sakurano et al. |
| 2015/0171129 | A1 | 6/2015 | Sakurano et al. |
| 2015/0214413 | A1 | 7/2015 | Negoro et al. |
| 2015/0229293 | A1 | 8/2015 | Nagahisa et al. |

OTHER PUBLICATIONS

U.S. Appl. No. 07/550,154, filed Jul. 9, 1990.
U.S. Appl. No. 14/641,683, filed Mar. 9, 2015.
U.S. Appl. No. 14/788,991, filed Jul. 1, 2015.

SOLID-STATE IMAGE SENSING DEVICE WITH ELECTRODE IMPLANTED INTO DEEP TRENCH

CROSS-REFERENCE TO RELATED APPLICATION

This patent application is based on and claims priority pursuant to 35 U.S.C. §119(a) to Japanese Patent Application No. 2014-224272, filed on Nov. 4, 2014, in the Japan Patent Office, the entire disclosure of which is hereby incorporated by reference herein.

BACKGROUND

Technical Field

Embodiments of the present invention relate to a solid-state image sensing device.

Background Art

In the field of semiconductor devices using semiconductor substrates, image sensors (solid-state image sensing devices) in which photoelectric conversion elements are two-dimensionally arranged and formed are known in the art. More specifically, image sensors are known in the art where pairs of photoelectric conversion elements and transistors form pixels and neighboring pixels are separated from each other by a silicon oxide film.

SUMMARY

Embodiments of the present invention described herein provide an improved solid-state image sensing device including a plurality of pixels. The solid-state image sensing device includes a first semi-conducting layer of a first conductivity, a second semi-conducting layer of the first conductivity disposed on the first semi-conducting layer, a semiconductor region of a second conductivity different from the first conductivity disposed in the second semi-conducting layer, a deep trench provided for each of the plurality of pixels and configured to isolate the neighboring pixels from each other, and an electrode implanted into the deep trench. The semiconductor region of second conductivity, the second semi-conducting layer, and the first semi-conducting layer are disposed in that order from a proximal side to a distal side, the second semi-conducting layer is split by the deep trench into sections that correspond to the pixels, an impurity concentration of first conductivity of the first semi-conducting layer is higher than an impurity concentration of first conductivity of the second semi-conducting layer, and the deep trench contacts the first semi-conducting layer.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

Figure 1:
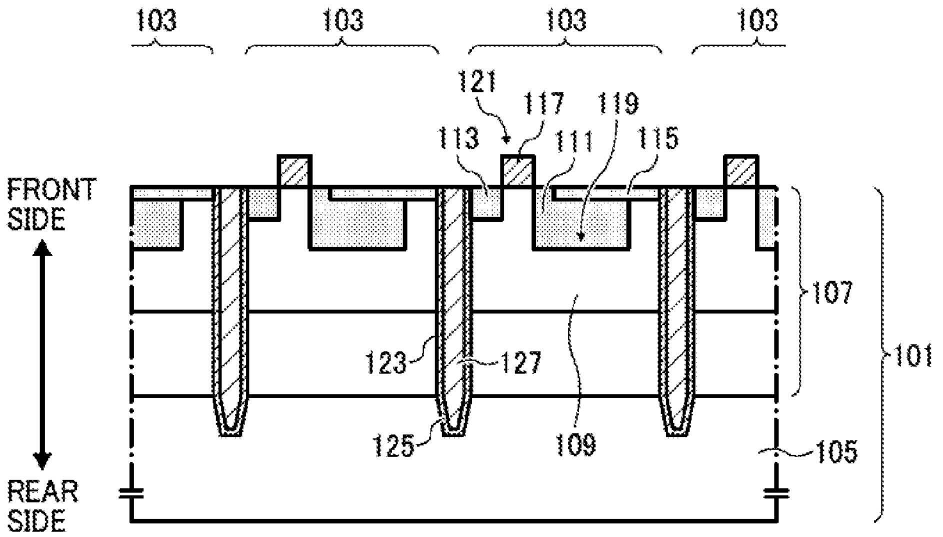
FIG. 1 is a schematic sectional view of a solid-state image sensing device according to an embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

In a solid-state image sensing device according to an embodiment of the present invention, the impurity concentration of first conductivity of a first semi-conducting layer is, for example, higher than $2*10^{18}$ $cm^{-3}$. Preferably, the impurity concentration of first conductivity of the first semi-conducting layer is higher than $2*10^{19}$ $cm^{-3}$. However, the impurity concentration of first conductivity of the first semi-conducting layer is equal to or lower than $2*10^{18}$ $cm^{-3}$.

In a solid-state image sensing device according to an embodiment of the present invention, for example, the first semi-conducting layer may be shared by a plurality of pixels. Alternatively, however, the first semi-conducting layer may be provided for each of the pixels.

In a solid-state image sensing device according to an embodiment of the present invention, for example, a deep trench may penetrate the first semi-conducting layer. Alternatively, however, the deep trench does not have to penetrate the first semi-conducting layer as long as the deep trench reaches the first semi-conducting layer.

In a solid-state image sensing device according to an embodiment of the present invention, for example, an electrode may be polysilicon of second conductivity. Alternatively, however, the electrode may be formed by other conductive materials. For example, the electrode may be formed, for example, by polysilicon of first conductivity, a semi-conducting material of first or second conductivity other than polysilicon, or by a conductive material other than the semi-conducting material.

In a solid-state image sensing device according to an embodiment of the present invention, for example, a pixel may be provided with a phototransistor. In such a mode, a phototransistor is provided as a photoelectric conversion element, and thus the output signal can be amplified due to the amplification of the transistor.

In a solid-state image sensing device according to an embodiment of the present invention, for example, a pixel may be provided with a pin photodiode or an avalanche photodiode. In such a mode, the output signal that is generated by light can be made greater compared with when the photoelectric conversion element is, for example, a PN junction photodiode, as a pin photodiode or an avalanche photodiode is provided as a photoelectric conversion element.

In a solid-state image sensing device according to an embodiment of the present invention, for example, a silicon oxide film or a silicon nitride film may be implanted into a deep trench. In such a mode, the manufacturing processes may be simplified compared with when an electrode is implanted into the deep trench, as the oxidation processes in which the electrode is insulated from a semi-conducting layer can be reduced. The material that may be implanted in the deep trench is not limited to the materials described above.

As devices on which photoelectric conversion elements are arrayed in two dimensions, solid-state image sensing devices such as complementary metal oxide semiconductor (CMOS) sensors and charge-coupled device (CCD) sensors are known.

In particular, a CMOS sensor uses a photodiode as photoelectric conversion element, and outputs the signals of the photodiode in a selective manner using metal oxide semiconductor field-effect transistors (MOSFET) provided for each pixel. Due to this configuration, it is possible for a CMOS sensor to be used to build elements such as photoelectric conversion elements, output selecting switches provided for each pixel, and peripheral circuits, all on the same substrate using known CMOS semiconductor processes.

Currently, processing rules of CMOS sensors are divided into finer sections, and the size of a single pixel is reduced. Accordingly, imaging at higher resolution is progressing.

The photodiode that is used as a photoelectric conversion element is formed by a PN junction. As known in the art, a depletion layer is formed by applying reverse bias voltage to the PN junction of the photodiode. The wavelength of light that can be converted into electric charge is determined by the width of the depletion layer.

As known in the art, the PN junction of a photodiode is formed in the vertical direction with reference to the semiconductor substrate. Accordingly, the depletion layer extends in the depth direction of the substrate. The light that has entered the photodiode is photoelectrically converted at a deep portion of the semiconductor substrate.

The light that enters the photodiode does not always have an angle of incidence of ninety degrees to the pixels but has a variety of angles. For this reason, the electric charge caused by the incident light may be output to the pixel next to the pixel that the light has actually entered. As the size of one pixel is reduced, such mixture of pixel output tends to occur more easily.

To prevent such mixture, a deep-trench structure is used in the embodiments of a solid-state image sensing device, described below, to separate neighboring pixels from each other.

Figure 2:
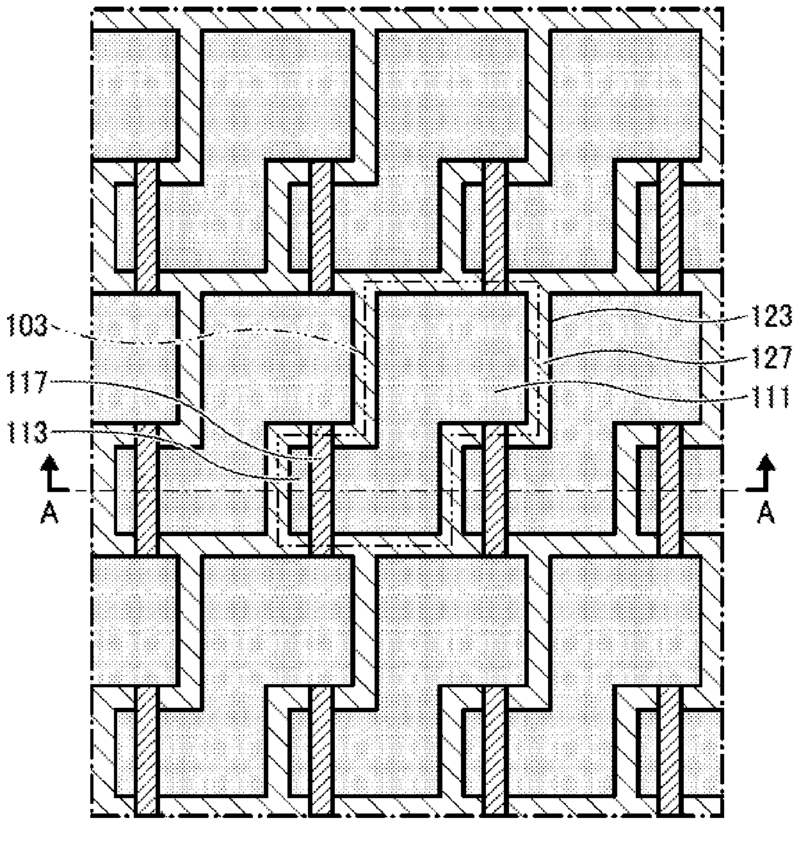
FIG. 2 is a schematic plan view of the solid-state image sensing device illustrated in FIG. 1.
Figure 3A:
FIGS. 3A to 3D are sectional views illustrating an example of the manufacturing processes of the solid-state image sensing device illustrated in FIG. 1.
Figure 3B:
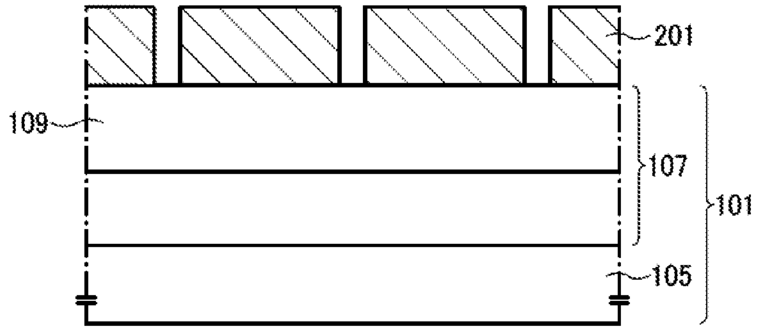
Figure 3C:
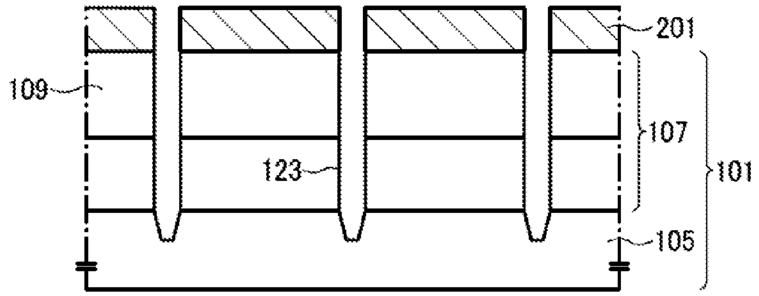
Figure 3D:
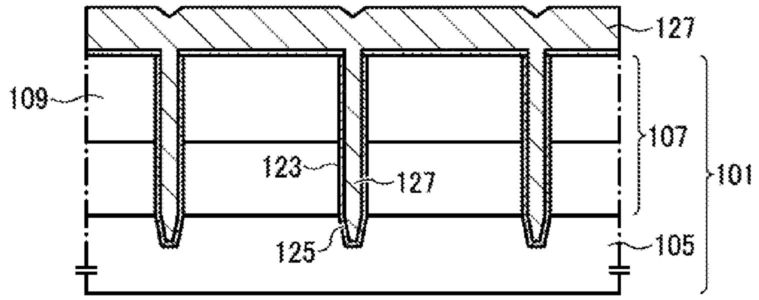

FIG. 1 is a schematic sectional view of a solid-state image sensing device according to an embodiment of the present invention. FIG. 2 is a schematic plan view of the solid-state image sensing device illustrated in FIG. 1. The cross section of FIG. 1 corresponds to the line A-A of FIG. 2. In the present embodiment, a PN junction photodiode is provided as a photoelectric conversion element.

On a semiconductor substrate 101, a plurality of pixels 103 of a CMOS image sensor are formed. The planar dimension of each of the pixels 103 is, for example, 2.5*2.5 micrometer (μm).

The semiconductor substrate 101 is formed, for example, by silicon. The semiconductor substrate 101 is formed, for example, by a P+ silicon substrate 105 (i.e., a first semi-conducting layer of first conductivity) and a P-type silicon layer 107 (i.e., a second semi-conducting layer of first conductivity) that is formed on the P+ silicon substrate 105.

The P+ silicon substrate 105 contains P-type impurities of higher concentration than the P-type silicon layer 107. The P-type impurity concentration of the P+ silicon substrate 105 is higher than that of portions of the P-type silicon layer 107 that contact the P+ silicon substrate 105. The P-type impurity concentration of the P+ silicon substrate 105 is, for example, about $2*10^{19}$ $cm^{-3}$. The electrical resistivity of the P+ silicon substrate 105 is, for example, about 0.006 ohm (Ω)·centimeter (cm). When the P-type impurity concentration (impurity concentration of first conductivity) of the P+ silicon substrate 105 is, for example, higher than $2*10^{18}$ $cm^{-3}$, the formation of an inversion layer can be prevented. The P+ silicon substrate 105 is, for example, connected to the ground (GND).

The P-type silicon layer 107 is, for example, a silicon layer that is formed by epitaxial growth. The P-type impurity concentration of the P-type silicon layer 107 is, for example, about $2*10^{16}$ $cm^{-3}$. The electrical resistivity of the P-type silicon layer 107 is, for example, about 1.0 Ω·cm. The thickness of the P-type silicon layer 107 is, for example, about 3.0 to 5.0 μm.

On the proximal side of the P-type silicon layer 107, a P-well 109 is formed. The P-type impurity concentration of the P-well 109 is higher than that of the P-type silicon layer 107. The substantial P-type impurity concentration of the P-well 109 is, for example, about $1*10^{17}$ $cm^{-3}$. Moreover, the depth of the P-well 109 is, for example, about 1 to 2 μm. In FIG. 2, the description of the P-well 109 is omitted.

On the proximal side of the P-type silicon layer 107, an N+ diffusion layer 111 (semiconductor region of second conductivity), an N+ diffusion layer 113, and a P+ diffusion layer 115 are formed for each of the pixels 103. The N+ diffusion layer 111, the N+ diffusion layer 113, and the P+ diffusion layer 115 are formed at depths shallower than the P-well 109. In FIG. 2, the description of the P+ diffusion layer 115 is omitted.

In each of the pixels 103, the N+ diffusion layer 111 and the N+ diffusion layer 113 are spaced from each other. The N+ diffusion layer 111 is formed at depths greater than the N+ diffusion layer 113. The substantial N-type impurity concentration of the N+ diffusion layer 111 and the N+ diffusion layer 113 is, for example, about $5*10^{20}$ $cm^{-3}$.

Moreover, the depth of the N+ diffusion layer 111 is, for example, about 200 to 300 nanometer (nm).

The region in which P+ diffusion layer 115 is formed partly overlaps the region in which the N+ diffusion layer 111 is formed. The P+ diffusion layer 115 is formed at depths shallower than the N+ diffusion layer 111. The substantial P-type impurity concentration of the P+ diffusion layer 115 is higher than that of the P-well 109.

A gate electrode 117 is formed on the P-well 109 between the N+ diffusion layer 111 and the N+ diffusion layer 113, having a gate insulator film therebetween. The P+ diffusion layer 115 and the gate electrode 117 are spaced from each other.

In each of the pixels 103, a PN junction photodiode (photoelectric conversion element) 119 that includes the P-well 109 and the N+ diffusion layer 111 is formed.

The P-well 109 serves as the anode of the PN junction photodiode 119. The N+ diffusion layer 111 serves as the cathode of the PN junction photodiode 119. The P+ diffusion layer 115 serves as the protective layer of the surface of the PN junction photodiode 119.

The P-type silicon layer 107 serves as the anode of the PN junction photodiode 119. The P+ silicon substrate 105 serves as an anode that is shared by the PN junction photodiodes 119 of the pixels 103. The PN junction photodiode 119 has a PN junction between the P-well 109 and the N+ diffusion layer 111.

In the pixels 103, a transistor 121 including the N+ diffusion layer 111, the N+ diffusion layer 113, and the gate electrode 117, which form a MOSFET, is formed. The transistor 121 serves as an output selecting switch of the pixels 103.

The deep trench 123 is formed in the semiconductor substrate 101 so as to surround each of the pixels 103. The deep trench 123 isolates the neighboring pixels 103 from each other. Moreover, the deep trench 123 isolates the neighboring PN junction photodiodes 119 from each other.

In the deep trench 123, an electrode 127 is implanted having an insulator film 125 therebetween. The insulator film 125 is, for example, a silicon oxide film. The electrode 127 is formed, for example, by a semi-conducting material. In the present embodiment, the electrode 127 is formed, for example, by N-type polysilicon. In FIG. 2, the description of the insulator film 125 is omitted. The gate electrode 117 and the electrode 127 are insulated from each other by an insulator film.

The deep trench 123 is formed at depths greater than the bottom of the P-type silicon layer 107. The deep trench 123 reaches the P+ silicon substrate 105. Moreover, the depth of the deep trench 123 is, for example, about 3.0 to 5.0 μm with reference to the surface of the P-type silicon layer 107 (the surface of the P-well 109). The width of the deep trench 123 is, for example, about 0.3 to 0.4 μm.

When the solid-state image sensing device according to the present embodiment is driven, the electrical characteristics of the pixels 103 are changed when a desired level of voltage is applied to the electrode 127.

In the present embodiment, mixture of photoelectric charge can be prevented among neighboring pixels 103 by isolating the neighboring pixels 103 from each other by the deep trench 123.

Further, the deep trench 123 reaches the P+ silicon substrate 105 in the present embodiment. Accordingly, mixture of photoelectric charge among the neighboring pixels 103 can be prevented at a greater depth.

By applying voltage to the electrode 127, the carrier concentration of the P-type silicon layer 107 and the P-well 109 is inverted near the deep trench 123. If the deep trench 123 does not reach the P+ silicon substrate 105, the carrier concentration of the P-type silicon layer 107 is also inverted near the bottom of the deep trench 123, and an N-type channel (inversion layer) that renders the N+ diffusion layers 111 of the neighboring pixels 103 electrically conductive with each other may be formed.

More specifically, such a channel is formed as the P-type region (of the P-well 109 and the P-type silicon layer 107) that contacts the deep trench 123 between the N+ diffusion layers 111 of the neighboring pixels 103 is inverted to the N-type. For example, when the film thickness of the insulator film 125 that is made of silicon oxide film is 20 nm in the present embodiment, the inverted voltages of the P-well 109 and the P-type silicon layer 107 are about 0.620 volt (V) and 0.051 V, respectively. As the P+ silicon substrate 105 is the GND, in such cases, the N+ diffusion layers 111 of the neighboring pixels 103 become conductive with each other when the voltage of the electrode 127 is so strong that the P-type silicon layer 107 and the P-well 109 are inverted.

The carriers that are generated by light increase the potential difference between the N+ diffusion layer 111 and the P-well 109. Note that such carriers are generated by light all over the semiconductor substrate 101. Although the distance that such carriers reach from the surface of the semiconductor substrate 101 varies according to the wavelength of the light, for example, carriers are generated throughout the entire range of the P-type silicon layer 107.

However, when an N-type channel that renders the N+ diffusion layers 111 of the neighboring pixels 103 become electrically conductive with each other is formed, the N+ diffusion layers 111 of the neighboring pixels 103 have the same electrical potential. Accordingly, the signal components of the carriers generated by light become the same. As a result, differences among the pixels 103 disappear, and the functionality as an imager is lost.

In the present embodiment, the deep trench 123 reaches the P+ silicon substrate 105. The P-type impurity concentration of the P+ silicon substrate 105 is higher than that of the P-type silicon layer 107. Accordingly, the P+ silicon substrate 105 is more resistant to the formation of an inversion layer caused due to the application of voltage to the electrode 127, than the P-type silicon layer 107. In other words, in the P+ silicon substrate 105, a higher level of voltage is required to form an inversion layer at the bottom of the deep trench 123 when a voltage is applied to the electrode 127.

Due to the P+ silicon substrate 105 with high P-type impurity concentration disposed at the bottom of the deep trench 123, application of very high voltage to the electrode 127 is required to invert portions at the bottom of the deep trench 123. Accordingly, the formation of an inversion layer at the bottom of the deep trench 123 is substantially prevented. As a result, the electric conduction among the N+ diffusion layers 111 of the neighboring pixels 103 due to the application of voltage to the electrode 127 is prevented.

In the present embodiment, neighboring pixels 103 are completely isolated from each other by the deep trench 123. Accordingly, there are advantageous effects in the present embodiment such that it becomes easier to reduce the distance among neighboring pixels 103 and the size of one pixel is reduced, compared with known CMOS semiconductor processes where neighboring pixels are separated from each other by oxide films and PN junctions.

The same can be said of cases where P-type is used instead of N-type. In the deep trench 123, an insulating material such as a silicon oxide film and a silicon nitride film may be implanted in place of the electrode 127. When an insulating material is implanted into the deep trench 123, the manufacturing process can be simplified, for example, by eliminating the oxidation processes or the process of forming an insulator film on the inner wall of the deep trench 123. Note also that the insulating material that may be implanted in the deep trench 123 is not limited to a silicon oxide film and a silicon nitride film.

FIGS. 3A to 3D are sectional views illustrating an example of the manufacturing processes of a solid-state image sensing device according to the present embodiment described above with reference to FIG. 1 and FIG. 2. The processes (a) to (d) are described with reference to FIGS. 3A to 3D, respectively. The process (e) is described with reference to FIG. 1 and FIG. 2. Note that the manufacturing processes of a solid-state image sensing device according to the present embodiment described above with reference to FIG. 1 and FIG. 2 are not limited to the example manufacturing processes described below.

In the process (a), the semiconductor substrate 101 where the P-type silicon layer 107 is epitaxially grown on the P+ silicon substrate 105 is used. Boron is injected into the P-type silicon layer 107, for example, at 30 KeV and $1*10^{13}$ $cm^{-2}$, including a region in which a photoelectric conversion element is formed. Then, drive-in diffusion is performed for an hour at 1150 degree Celsius in the atmosphere of nitrogen gas, and the boron that has been implanted into the P-type silicon layer 107 is diffused to form the P-well 109.

In the process (b), as a hard mask for forming the deep trench that isolates the neighboring pixels 103 from each other, for example, a high-temperature oxide (HTO) film 201 is formed on the P-well 109 with the thickness of about 400 nm. Then, the HTO film 201 is removed at the regions where the deep trench is formed by using photoengraving or etching to form a hard mask with a deep trench that corresponds to the above-described deep trench. In the present embodiment, each deep trench of the HTO film 201 has a width of, for example, about 0.3 to 0.4 μm.

In the process (c), the deep trench 123 is formed using the hard mask made of the HTO film 201, by using the etching technique. The deep trench 123 is formed with the depth so as to penetrate the P-type silicon layer 107 and reach the P+ silicon substrate 105. For example, microwave plasma etching with $SF_6$, $O_2$, and Ar gas is performed to form the deep trench 123 in the direction orthogonal to the surface of the P-type silicon layer 107. The depth of the deep trench 123 is, for example, about 3.0 to 5.0 μm. Moreover, the width of the deep trench 123 is, for example, about 0.3 to 0.4 μm. Because the hard mask is also etched in the present embodiment, the HTO film 201 is made relatively thin; i.e., to a thickness of about 100 nm.

In the process (d), the HTO film 201 is removed, for example, by wet etching. The, oxidization is preformed to oxidize the inner wall of the deep trench 123. In this oxidization, for example, a silicon oxide film with the thickness of about 130 nm is formed by dry oxidation at 1050 degree Celsius. Then, the silicon oxide film that is formed on the inner wall of the deep trench 123 is removed. By removing the silicon oxide film, damage of the microwave plasma etching can be made good. Accordingly, crystal defects that may occur when the deep trench 123 is formed can be minimized, and leakage current that may occur when a photodiode is formed by a PN junction can be prevented.

Next, oxidization is performed again to insulate the neighboring pixels 103 from each other, and the insulator film 125 that is made of silicon oxide film is formed on the inner wall of the deep trench 123. For example, the oxidization is wet oxidation with 850 degree Celsius performed such that a silicon oxide film with the thickness of about 20 nm is formed. A film of semi-conducting material, for example, a film of polysilicon, is formed with the thickness of about 800 nm, to fill the deep trench 123. In the deep trench 123, the electrode 127 is implanted having the insulator film 125 therebetween.

In the process (e), the electrode 127 is etched in its entirety, and excess portions of the electrode 127 are removed, leaving the portions of the electrode 127 that are implanted into the deep trench 123. After that, the PN junction photodiode 119 and the transistor 121 that selectively outputs the signals of the PN junction photodiode 119 are formed using the CMOS semiconductor processing known in the art (see FIG. 1 and FIG. 2).

Figure 4:
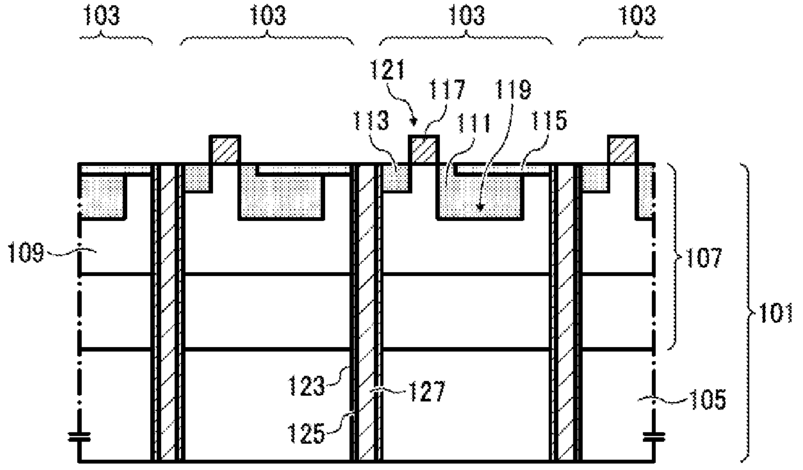
FIG. 4 is a schematic sectional view of a solid-state image sensing device according to another embodiment of the present invention.

FIG. 4 is a schematic sectional view of a solid-state image sensing device according to another embodiment of the present invention. In the embodiment described above, the bottom of the deep trench 123 is disposed in the P+ silicon substrate 105. However, the deep trench 123 may penetrate the P+ silicon substrate 105 as illustrated in FIG. 4.

In the embodiment described above, the PN junction photodiode 119 is used as a photoelectric conversion element. However, in a solid-state image sensing device of the present embodiment, the photoelectric conversion element is not limited to a PN junction photodiode. For example, other kinds of elements such as a phototransistor, a pin photodiode, and an avalanche photodiode may be used as a photoelectric conversion element.

Figure 5:
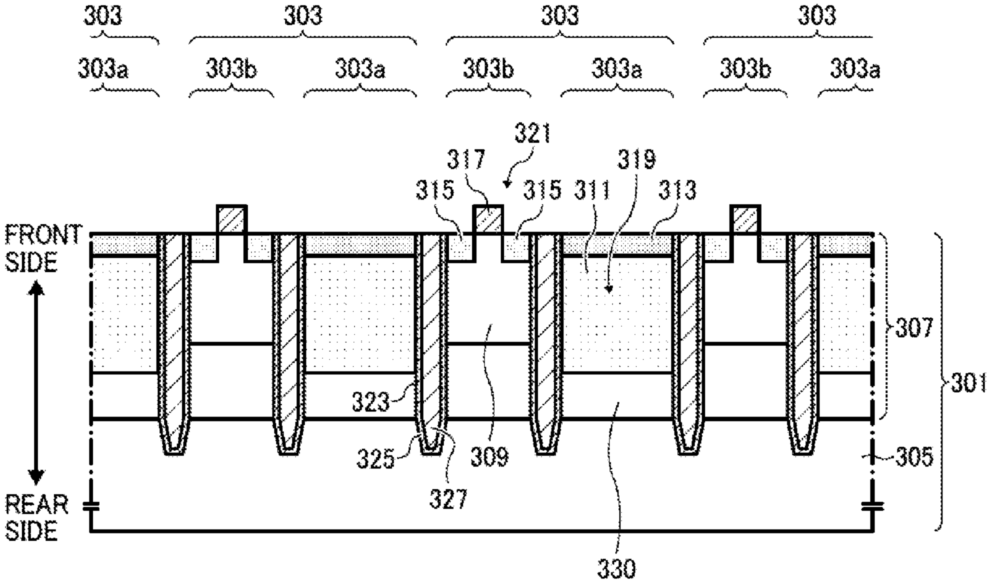
FIG. 5 is a schematic sectional view of a solid-state image sensing device according to yet another embodiment of the present invention.
Figure 6:
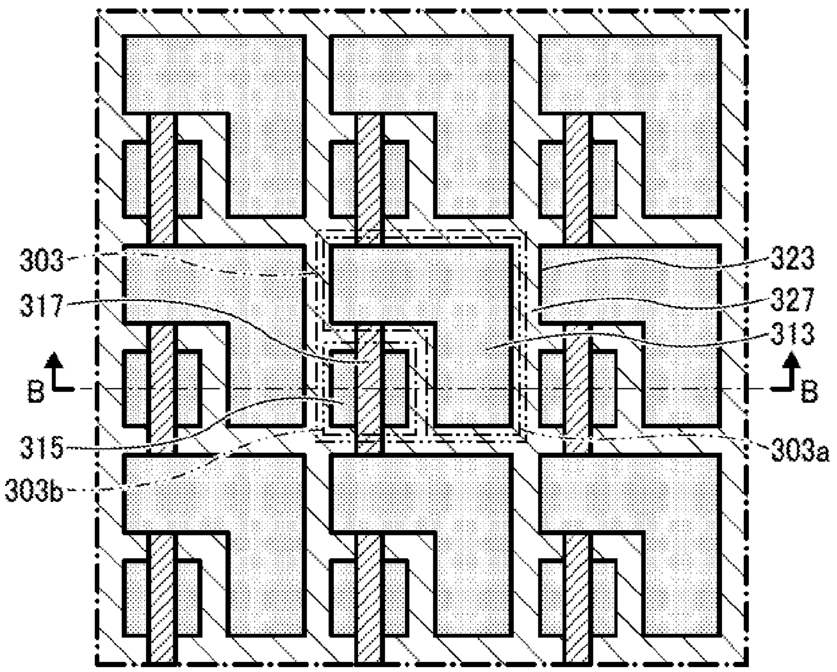
FIG. 6 is a schematic plan view of the solid-state image sensing device illustrated in FIG. 5.

FIG. 5 is a schematic sectional view of a solid-state image sensing device according to yet another embodiment of the present invention. FIG. 6 is a schematic plan view of the solid-state image sensing device illustrated in FIG. 5. The cross section of FIG. 5 corresponds to the line B-B position of FIG. 6. In this embodiment, a phototransistor is provided as a photoelectric conversion element.

On a semiconductor substrate 301, pixels 303 of a CMOS image sensor are formed. The planar dimension of each of the pixels 303 is, for example, 5.0*5.0 μm.

The semiconductor substrate 301 is formed, for example, by an N+ silicon substrate 305 (i.e., a first semi-conducting layer of first conductivity) and an N-type silicon layer 307 that is formed on the P+ silicon substrate 305.

The N+ silicon substrate 305 contains N-type impurities of higher concentration than the N-type silicon layer 307. The N-type impurity concentration of the N+ silicon substrate 305 is higher than that of portions of the N-type silicon layer 307 that contact the N+ silicon substrate 305. The N-type impurity concentration of the N+ silicon substrate 305 is, for example, about $2*10^{19}$ $cm^{-3}$. The electrical resistivity of the N+ silicon substrate 305 is, for example, about 0.006 Ω·cm. When the N-type impurity concentration (impurity concentration of first conductivity) of the N+ silicon substrate 305 is, for example, higher than $2*10^{18}$ $cm^{-3}$, the formation of an inversion layer can be prevented. A desired level of voltage, for example, 5 V, is applied to the N+ silicon substrate 305.

The N-type silicon layer 307 is, for example, a silicon layer that is formed by epitaxial growth. The N-type impurity concentration of the N-type silicon layer 307 is, for example, about $2*10^{16}$ $cm^{-3}$. The electrical resistivity of the N-type silicon layer 307 is, for example, about 1.0 Ω·cm. The thickness of the N-type silicon layer 307 is, for example, about 3.0 to 5.0 μm.

On the proximal side of the N-type silicon layer 307, an N-well 309 is formed. The N-type impurity concentration of the N-well 309 is higher than that of the N-type silicon layer 307. The substantial N-type impurity concentration of the N-well 309 is, for example, about $1*10^{17}$ $cm^{-3}$. Moreover, the depth of the N-well 309 is, for example, about 1 to 2 μm.

On the proximal side of the N-type silicon layer 307 in the phototransistor region 303*a* of each of the pixels 303, a P-type diffusion layer 311 (semiconductor region of second conductivity) is formed. The P-type diffusion layer 311 is formed at depths greater than the N-well 309. The P-type diffusion layer 311 is formed at depths so as not to reach the N+ silicon substrate 305. Moreover, the depth of the P-type diffusion layer 311 is, for example, about 1 to 2 μm with reference to the surface of the N-type silicon layer 307. The substantial P-type impurity concentration of the P-type diffusion layer 311 is, for example, about $3*10^{15}$ $cm^{-3}$. In the phototransistor region 303*a*, the N-well 309 is not formed.

The N-type silicon layer 307 of the phototransistor region 303*a* that is disposed under the P-type diffusion layer 311 is referred to as an N-type silicon layer 330 (second semiconducting layer of first conductivity). The N-type impurity concentration of the N-type silicon layer 330 is same as that of the N-type silicon layer 307, and is for example, about $2*10^{16}$ $cm^{3}$.

On the proximal side of the N-type silicon layer 307 in the phototransistor region 303*a* of each of the pixels 303, an N+ diffusion layer 313 is formed. The N+ diffusion layer 313 is formed at depths shallower than the P-type diffusion layer 311. The substantial N-type impurity concentration of the N+ diffusion layer 313 is, for example, about $3*10^{15}$ cm-3. Moreover, the depth of the N+ diffusion layer 313 is, for example, about 0.2 to 0.3 μm with reference to the surface of the N-type silicon layer 307. The N+ diffusion layer 313 is, for example, connected to the GND.

On the proximal side of the N-well 309 in the output selecting switch region 303*b* of each of the pixels 303, a pair of P+ diffusion layers 315 are formed with space therebetween. The substantial P-type impurity concentration of the P+ diffusion layer 315 is, for example, about $5*10^{20}$ $cm^{-3}$. Moreover, the depth of the P+ diffusion layer 315 is, for example, about 200 to 300 nm.

In the output selecting switch region 303*b* of each of the pixels 303, a gate electrode 317 is formed on the N-well 309 between the pair of P+ diffusion layers 315, having a gate insulator film therebetween.

In the phototransistor region 303*a* of each of the pixels 303, a phototransistor 319 including an N-type silicon layer 330, a P-type diffusion layer 311, and an N+ diffusion layer 313 is formed.

The N-type silicon layer 330 serves as the collector of the phototransistor 319. The P-type diffusion layer 311 serves as the base of the phototransistor 319. The N+ diffusion layer 313 serves as the emitter of the phototransistor 319.

The N+ silicon substrate 305 serves as a collector that is shared by the phototransistors 319 of the pixels 303. Each of the phototransistors 319 has two PN junctions between the N-type silicon layer 330 and the P-type diffusion layer 311 and between the P-type diffusion layer 311 and the N+ diffusion layer 313, respectively.

In the pixels 303, a transistor 321 including the pair of P+ diffusion layer 315 and the gate electrode 317, which together form a MOSFET, is formed in the output selecting switch region 303*b*. The transistor 321 serves as an output selecting switch of the pixels 303.

A deep trench 323 is formed in the semiconductor substrate 301 so as to surround each of the pixels 303. The deep trench 323 isolates the neighboring pixels 303 from each other. Moreover, the deep trench 323 isolates the neighboring phototransistors 319 from each other. Further, the deep trench 323 isolates the phototransistor 319 and the transistor 321 from each other in each of the pixels 303. Note that it is not necessary for the phototransistor 319 and the transistor 321 to be isolated from each other by the deep trench 323.

In the deep trench 323, an electrode 327 is implanted having an insulator film 325 therebetween. The insulator film 325 is, for example, silicon oxide film. The electrode 327 is formed, for example, by a semi-conducting material. In the present embodiment, the electrode 327 is formed, for example, by N-type polysilicon. In FIG. 6, the description of the insulator film 325 is omitted. The gate electrode 317 and the electrode 327 are insulated from each other by an insulator film.

Alternatively, an insulating material may be implanted into the deep trench 323 in place of the insulator film 325 and the electrode 327. Such an insulating material includes, for example, a silicon oxide film and a silicon nitride film.

The deep trench 323 is formed at depths greater than the bottom of the N-type silicon layer 307 and the N-type silicon layer 330. The deep trench 323 reaches the N+ silicon substrate 305. Moreover, the depth of the deep trench 323 is, for example, about 3.0 to 5.0 μm with reference to the surface of the N-type silicon layer 307. The width of the deep trench 323 is, for example, about 0.3 to 0.4 μm.

When the solid-state image sensing device according to the present embodiment is driven, the electrical characteristics of the pixels 303 are changed when a desired level of voltage is applied to the electrode 327.

In the present embodiment, mixture of photoelectric charge can be prevented among neighboring pixels 303 by isolating the neighboring pixels 303 from each other by the deep trench 323.

Further, the deep trench 323 reaches the N+ silicon substrate 305 in the present embodiment. Accordingly, confusion about electric charge caused at the neighboring pixels 303 can be prevented at a greater depth. Further, the deep trench 323 reaches the N+ silicon substrate 305 in the present embodiment. As a result, the electric conduction among the P-type diffusion layers 311 of the neighboring pixels 303 due to the application of voltage to the electrode 327 is prevented.

An N-type inversion layer is formed near the deep trench 323 of the P-type diffusion layer 311 when voltage equal to or greater than the voltage of the electrode 327 is applied to the P-type diffusion layer 311. For example, when the P-type diffusion layer 311 carries voltage of about 1 V and the film thickness of the insulator film 325 that is made of silicon oxide film is 20 nm as in the present embodiment, the voltage at which the P-type diffusion layer 311 is inverted is about −0.245 V in the electrode 327. In other words, for example, when voltage of about 0.755 to 5 V is applied to the electrode 327, an N-type inversion layer is formed in the P-type diffusion layer 311.

A P-type inversion layer is formed near the deep trench 323 of the N-type silicon layer 330 when voltage equal to or lower than the voltage of the electrode 327 is applied to the N-type silicon layer 330. For example, when the N-type silicon layer 330 carries voltage of about 5 V and the film thickness of the insulator film 325 that is made of silicon oxide film is 20 nm as in the present embodiment, the voltage at which the N-type silicon layer 330 is inverted is about −1.332 V in the electrode 327. In other words, for example, when voltage of about 0 to 3.668 V is applied to the electrode 327, a P-type inversion layer is formed in the N-type silicon layer 330. Note that no voltage is applied to the electrode 327 when voltage of 0 V is applied to the electrode 327.

When voltage of about 0 to 5 V is applied to the electrode 327, no P-type inversion layer is formed in the N+ silicon substrate 305.

If the deep trench 323 does not reach the N+ silicon substrate 305, the P-type diffusion layers 311 of the neighboring pixels 303 may become conductive with each other due to a P-type inversion layer formed in the N-type silicon layer 330 near the bottom of the deep trench 323.

For example, when voltage of about 0 to 0.755 V is applied to the electrode 327, a P-type inversion layer is formed in the N-type silicon layer 330 and no N-type inversion layer is formed in the P-type diffusion layer 311. Accordingly, the P-type diffusion layers 311 of the neighboring pixels 303 may become conductive with each other. By contract, when voltage of about 0.755 to 3.668 V is applied to the electrode 327, a P-type inversion layer is formed in the N-type silicon layer 330 but an N-type inversion layer is formed in the P-type diffusion layer 311. Accordingly, the P-type diffusion layers 311 of the neighboring pixels 303 do not become conductive with each other.

When the P-type diffusion layers 311 of the neighboring pixels 303 become conductive with each other and have the same electrical potential, the signal components of the carriers generated by light become the same among the neighboring pixels 303 and thus the functionality as an imager is lost.

In the present embodiment, the deep trench 323 reaches the N+ silicon substrate 305. The N-type impurity concentration of the N+ silicon substrate 305 is higher than that of the N-type silicon layer 330. Accordingly, the N+ silicon substrate 305 is more resistant to the formation of a P-type inversion layer, than the N-type silicon layer 330.

Due to the N+ silicon substrate 305 with high N-type impurity concentration disposed at the bottom of the deep trench 323, application of very high voltage to the N+ silicon substrate 305 is required to invert portions at the bottom of the deep trench 323. Accordingly, the formation of a P-type inversion layer at the bottom of the deep trench 323 is substantially prevented. As a result, the electric conduction among the P-type diffusion layers 311 of the neighboring pixels 303 is prevented. In the present embodiment, it is assumed that voltage of, for example, about 0 to 1 V is applied to the electrode 327.

In the present embodiment, neighboring pixels 303 are electrically completely isolated from each other by the deep trench 323. Accordingly, there are advantageous effects in the present embodiment that it becomes easier to reduce the distance among neighboring pixels 303 and the size of one pixel is reduced, compared with known CMOS semiconductor processes where neighboring pixels are separated from each other by oxide films and PN junctions.

In the present embodiment described above with reference to FIG. 5 and FIG. 6, a similar function and effect can be obtained even when N-type and P-type are replaced with each other.

Moreover, other kinds of elements such as a pin photodiode and an avalanche photodiode may be used as a photoelectric conversion element in the semiconductor device according to the present embodiment, in place of a PN junction photodiode or a phototransistor.

Figure 7:
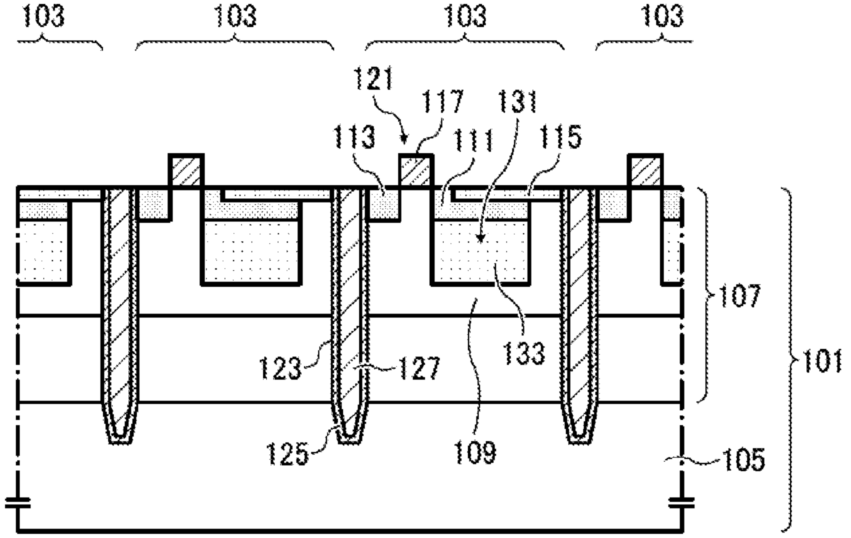
FIG. 7 is a schematic sectional view of a solid-state image sensing device according to yet another embodiment of the present invention.

FIG. 7 is a schematic sectional view of a solid-state image sensing device according to yet another embodiment of the present invention. In the present embodiment, a pin photodiode is provided as a photoelectric conversion element. In FIG. 7, like reference signs are given to elements similar to those illustrated in FIG. 1 and FIG. 2, and their redundant description is omitted.

In a solid-state image sensing device of the present embodiment, the pin photodiode 131 is provided as a photoelectric conversion element, in place of the PN junction photodiode 119 described above with reference to FIG. 1 and FIG. 2. The pin photodiode 131 includes the P+ silicon substrate 105, the P-type silicon layer 107, the P-well 109, the N+ diffusion layer 111, and an intrinsic region 133.

The P+ silicon substrate 105, the P-type silicon layer 107, and the P-well 109 serve as the anode of the pin photodiode 131. The N+ diffusion layer 111 serves as the cathode of the pin photodiode 131.

The intrinsic region 133 is an intrinsic semi-conducting layer that substantially includes no impurity. The intrinsic region 133 is disposed in contact with the P-well 109 and the N+ diffusion layer 111, at a position shallower than the P-well 109 and deeper than the N+ diffusion layer 111.

Accordingly, the output signal that is generated by light can be made greater compared with when the photoelectric conversion element is a PN junction photodiode, as the pin photodiode 131 is provided as a photoelectric conversion element.

Figure 8:
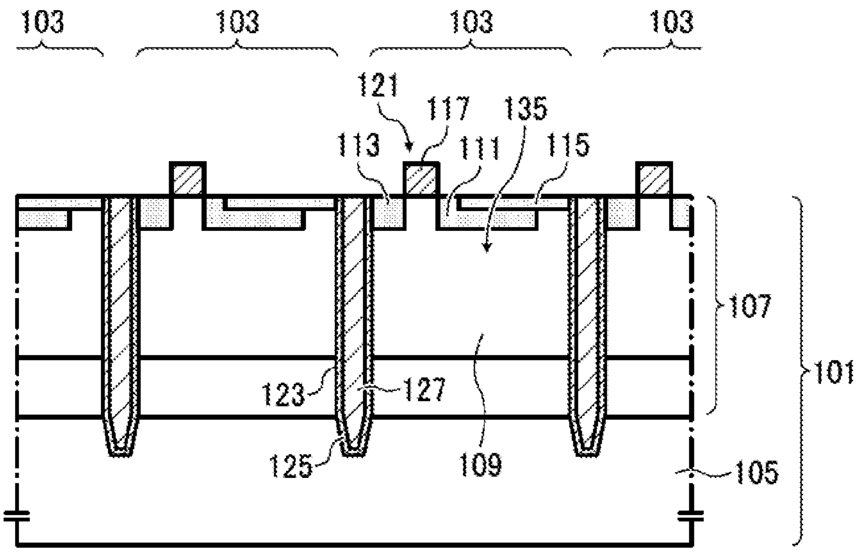
FIG. 8 is a schematic sectional view of a solid-state image sensing device according to yet another embodiment of the present invention.

FIG. 8 is a schematic sectional view of a solid-state image sensing device according to yet another embodiment of the present invention. In the present embodiment, an avalanche photodiode is provided as a photoelectric conversion element. In FIG. 8, like reference signs are given to elements similar to those illustrated in FIG. 1 and FIG. 2, and their redundant description is omitted.

In a solid-state image sensing device of the present embodiment, an avalanche photodiode 135 is provided as a photoelectric conversion element, in place of the PN junction photodiode 119 described above with reference to FIG. 1 and FIG. 2. The avalanche photodiode avalanche photodiode 135 includes the P+ silicon substrate 105, the P-type silicon layer 107, the P-well 109, and the N+ diffusion layer 111.

The P+ silicon substrate 105, the P-type silicon layer 107, and the P-well 109 serve as the anode of the avalanche photodiode 135. The N+ diffusion layer 111 serves as the cathode of the avalanche photodiode 135.

As the impurity concentration of the P-type silicon layer 107 is sufficiently low, a high electric field can be applied to the avalanche photodiode 135. When a high electric field is applied, carriers collide with atoms and an electron avalanche occurs. For this reason, the number of carriers can be increased. Accordingly, the avalanche photodiode 135 can increase the output signal that is generated by light.

Accordingly, the output signal that is generated by light can be made greater compared with when the photoelectric conversion element is a PN junction photodiode, as the avalanche photodiode 135 is provided as a photoelectric conversion element.

In the embodiments described above, vertical photodiodes or phototransistors are used. However, in a solid-state image sensing device of the present embodiment, a horizontal photodiode or phototransistor may be used as a photoelectric conversion element.

Figure 9:
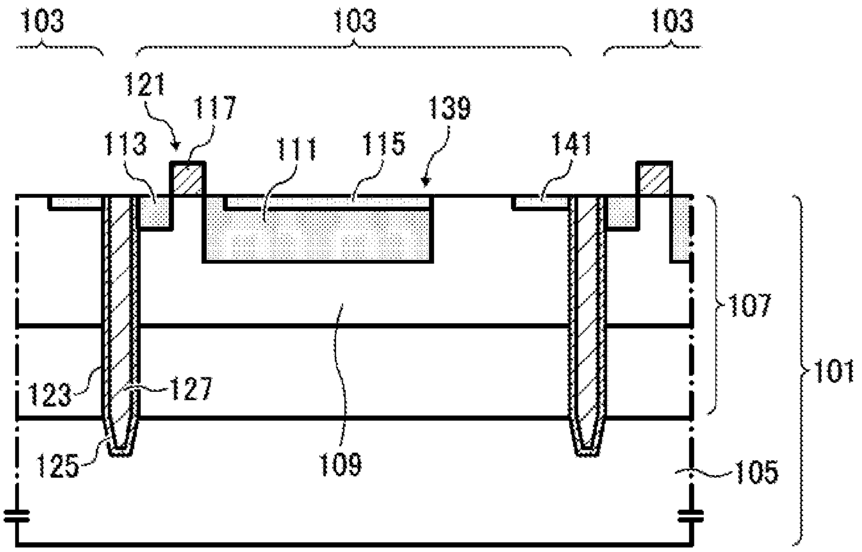
FIG. 9 is a schematic sectional view of a solid-state image sensing device according to yet another embodiment of the present invention.

FIG. 9 is a schematic sectional view of a solid-state image sensing device according to yet another embodiment of the present invention. In this embodiment, a horizontal PN junction photodiode is provided as a photoelectric conversion element. In FIG. 9, like reference signs are given to elements similar to those illustrated in FIG. 1 and FIG. 2, and their redundant description is omitted.

In a solid-state image sensing device of the present embodiment, a horizontal PN junction photodiode 139 is provided as a photoelectric conversion element, in place of the vertical PN junction photodiode 119 described above with reference to FIG. 1 and FIG. 2. The horizontal PN junction photodiode 139 includes the P-well 109 and the N+ diffusion layer 111.

The P-well 109 serves as the anode of the PN junction photodiode 139. The N+ diffusion layer 111 serves as the cathode of the PN junction photodiode 139. In the present embodiment, the P+ silicon substrate 105 and the P-type silicon layer 107 do not serve as the anode of the PN junction photodiode 139.

On the proximal side of the P-well 109, a P+ diffusion layer 141 is disposed. The P+ diffusion layer 141 is spaced from the N+ diffusion layer 111, the N+ diffusion layer 113, and the P+ diffusion layer 115. The P+ diffusion layer 141 is used as the anode contact of the PN junction photodiode 139.

As described above, in a solid-state image sensing device of the present embodiment, the horizontal PN junction photodiode 139 may be used as a photoelectric conversion element. Moreover, in a solid-state image sensing device of the present embodiment, a horizontal pin photodiode or a horizontal avalanche photodiode may be used as a photoelectric conversion element.

Figure 10:
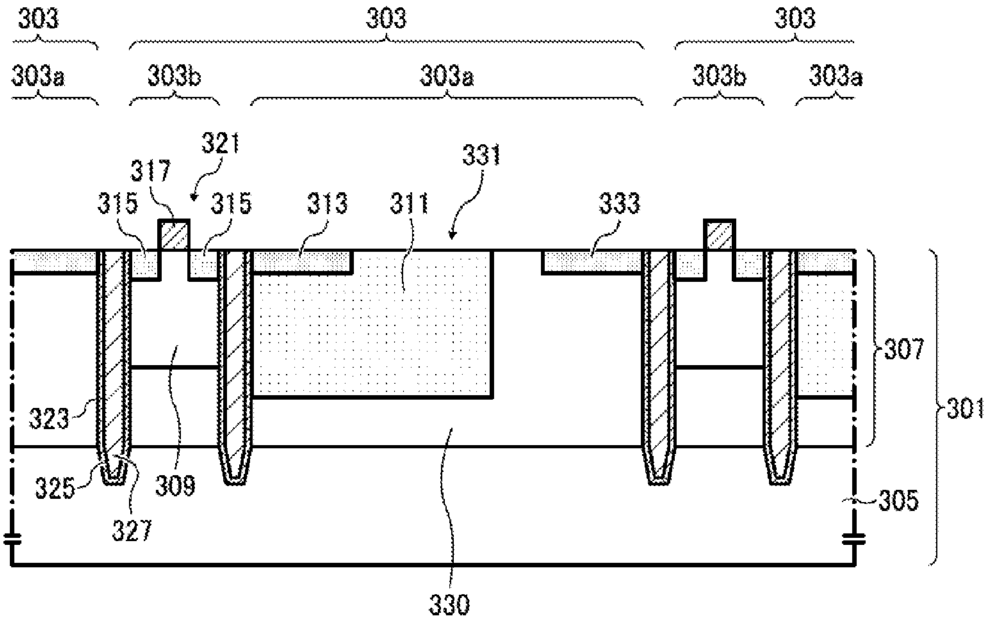
FIG. 10 is a schematic sectional view of a solid-state image sensing device according to yet another embodiment of the present invention.

FIG. 10 is a schematic sectional view of a solid-state image sensing device according to yet another embodiment of the present invention. In this embodiment, a horizontal phototransistor is provided as a photoelectric conversion element. In FIG. 10, like reference signs are given to elements similar to those illustrated in FIG. 5 and FIG. 6, and their redundant description is omitted.

In a solid-state image sensing device of the present embodiment, a horizontal phototransistor 331 is provided as a photoelectric conversion element in the phototransistor region 303*a*, in place of the vertical phototransistor 319 described above with reference to FIG. 5 and FIG. 6. The horizontal phototransistor 331 includes the P-type diffusion layer 311, N+ diffusion layer 313, and the N-type silicon layer 330 made of the N-type silicon layer 307.

The N-type silicon layer 330 serves as the collector of the phototransistor 331. The P-type diffusion layer 311 serves as the base of the phototransistor 331. The N+ diffusion layer 313 serves as the emitter of the phototransistor 331. In the present embodiment, the N+ silicon substrate 305 does not serve as the collector of the phototransistor 331.

On the proximal side of the N-type silicon layer 330 in the phototransistor region 303*a* of each of the pixels 303, an N+ diffusion layer 333 is disposed. The N+ diffusion layer 333 is spaced from the P-type diffusion layer 311 and the N+ diffusion layer 313. The N+ diffusion layer 333 is used as the collector contact of the phototransistor 331.

As described above, in a solid-state image sensing device of the present embodiment, the horizontal phototransistor 331 may be used as a photoelectric conversion element.

In the embodiments described above with reference to FIG. 7 to FIG. 10, a similar function and effect can be obtained even when N-type and P-type are replaced with each other.

The present invention is not limited to the details of the embodiments described above including numerical values, materials, arrangements, and the number of elements, and various modifications and improvements are possible.

In the embodiments described above, a silicon substrate is used as a semiconductor substrate. However, for example, different kinds of semiconductor substrate other than the silicon substrate may be used as a semiconductor substrate in the solid-state image sensing device of the embodiments described above.

In the solid-state image sensing device of the embodiments described above, the configuration of a photoelectric conversion element is not limited to the configuration of a photodiode described above with reference to FIG. 1 and FIG. 2, FIG. 7, FIG. 8, or FIG. 9. Moreover, the configuration of a photoelectric conversion element is not limited to the configuration of a phototransistor described above with reference to FIG. 5 and FIG. 6, or FIG. 10.

With the solid-state image sensing device according to the embodiments of the present invention, mixture of photoelectric charge among neighboring pixels can be prevented, and the size of one pixel can be reduced.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. A solid-state image sensing device including a plurality of pixels, comprising:

a first semi-conducting layer of first conductivity;

a second semi-conducting layer of first conductivity disposed on the first semi-conducting layer;

a semiconductor region of second conductivity different from the first conductivity disposed in the second semi-conducting layer;

a deep trench provided for each of the plurality of pixels and configured to isolate the neighboring pixels from each other; and an electrode implanted into the deep trench, wherein the semiconductor region of second conductivity, the second semi-conducting layer, and the first semi-conducting layer are disposed in that order from a proximal side to a distal side, the second semi-conducting layer is split by the deep trench into sections that correspond to the pixels, an impurity concentration of first conductivity of the first semi-conducting layer is higher than an impurity concentration of first conductivity of the second semi-conducting layer, and the deep trench contacts the first semi-conducting layer.

2. The solid-state image sensing device according to claim 1, wherein an impurity concentration of first conductivity of the first semi-conducting layer is higher than $2*10^{18}$ $cm^{-3}$.

3. The solid-state image sensing device according to claim 1, wherein an impurity concentration of first conductivity of the first semi-conducting layer is higher than $2*10^{19}$ $cm^{-3}$.

4. The solid-state image sensing device according to claim 1, wherein the first semi-conducting layer is shared by the plurality of pixels.

5. The solid-state image sensing device according to claim 1, wherein the deep trench penetrates the first semi-conducting layer.

6. The solid-state image sensing device according to claim 1, wherein the electrode is polysilicon of second conductivity.

7. The solid-state image sensing device according to claim 1, wherein each of the pixels is a phototransistor.

8. The solid-state image sensing device according to claim 1, wherein each of the pixels is a pin photodiode.

9. The solid-state image sensing device according to claim 1, wherein each of the pixels is an avalanche photodiode.

* * * * *